(12) United States Patent
Tetelbaum et al.

(10) Patent No.: US 8,010,935 B2
(45) Date of Patent: Aug. 30, 2011

(54) ELECTRONIC DESIGN AUTOMATION TOOL AND METHOD FOR OPTIMIZING THE PLACEMENT OF PROCESS MONITORS IN AN INTEGRATED CIRCUIT

(75) Inventors: Alexander Tetelbaum, Hayward, CA (US); Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 411 days.

(21) Appl. No.: 12/248,016

(22) Filed: Oct. 8, 2008

(65) Prior Publication Data
US 2009/0282381 A1    Nov. 12, 2009

Related U.S. Application Data

(60) Provisional application No. 61/126,881, filed on May 7, 2008.

(51) Int. Cl.
*G06F 17/50* (2006.01)
*G06F 15/04* (2006.01)

(52) U.S. Cl. ........ 716/138; 716/106; 716/108; 716/110; 716/111; 716/112; 716/113; 716/114; 716/118; 716/132; 716/133; 716/134; 716/135; 716/136; 714/25; 714/30; 714/47.1; 714/51; 714/53; 703/13; 703/14; 327/20; 327/21

(58) Field of Classification Search .......... 716/106–108, 716/110–114, 118–119, 132–136, 138; 703/13–14; 714/25, 30, 47.1, 51, 55, 733; 327/20–21
See application file for complete search history.

(56) References Cited

U.S. PATENT DOCUMENTS

| | | | | |
|---|---|---|---|---|
| 6,239,603 B1* | 5/2001 | Ukei et al. | ................. | 324/750.3 |
| 6,564,353 B2* | 5/2003 | Sano | ............................ | 716/114 |
| 6,853,177 B2* | 2/2005 | Shibayama et al. | ....... | 324/76.48 |
| 7,289,921 B1* | 10/2007 | Salmi et al. | ..................... | 702/65 |
| 7,417,482 B2* | 8/2008 | Elgebaly et al. | ............. | 327/278 |
| 7,576,569 B2* | 8/2009 | Carpenter et al. | ............. | 327/14 |
| 7,707,530 B2* | 4/2010 | Alpert et al. | .................. | 716/113 |
| 7,851,235 B2* | 12/2010 | Hong | ............................ | 438/14 |

\* cited by examiner

*Primary Examiner* — Nghia Doan

(57) ABSTRACT

An electronic design automation (EDA) tool for and method of optimizing a placement of process monitors (PMs) in an integrated circuit (IC). In one embodiment, the EDA tool includes: (1) a critical path/cell identifier configured to identify critical paths and critical cells in the IC, (2) a candidate PM position identifier coupled to the critical path/cell identifier and configured to identify a set of candidate positions for the PMs, (3) a cluster generator coupled to the critical path/cell identifier and configured to associate the critical cells to form clusters thereof and (4) a PM placement optimizer coupled to the candidate PM position identifier and the cluster generator and configured to place a PM within each of the clusters by selecting among the candidate positions.

20 Claims, 6 Drawing Sheets

ELECTRONIC DESIGN AUTOMATION TOOL AND METHOD FOR OPTIMIZING THE PLACEMENT OF PROCESS MONITORS IN AN INTEGRATED CIRCUIT

CROSS-REFERENCE TO PROVISIONAL APPLICATION

This application is related to U.S. Provisional Application Ser. No. 61/126,881, filed by Parker, et al., on May 7, 2008, entitled "A Novel Paradigm for Optimizing Performance, Power, Area and/or Yield in Integrated Circuits," commonly assigned with the invention and incorporated herein by reference.

TECHNICAL FIELD

The invention is directed, in general, to integrated circuit (IC) design and, more specifically, to an electronic design automation (EDA) tool and method for optimizing the placement of process monitors (PMs) in an integrated circuit (IC).

BACKGROUND

Conserving resources, including energy, has become a pre-eminent objective in today's world. Manufacturers of ICs are sensitive to the need to improve the energy efficiency of their products. National Semiconductor Corporation developed adaptive voltage scaling as part of that overall strategy. The idea behind adaptive voltage scaling was that an IC could be powered based on its actual electrical characteristics and current operating temperature, both of which in part determine signal propagation speed.

SUMMARY

One aspect of the invention provides an EDA tool for, and method of optimizing a placement of PMs in an IC. In one embodiment, the EDA tool includes: (1) a critical path/cell identifier configured to identify critical paths and critical cells in the IC, (2) a candidate PM position identifier coupled to the critical path/cell identifier and configured to identify a set of candidate positions for the PMs, (3) a cluster generator coupled to the critical path/cell identifier and configured to associate the critical cells to form clusters thereof and (4) a PM placement optimizer coupled to the candidate PM position identifier and the cluster generator and configured to place a PM within each of the clusters by selecting among the candidate positions.

In another embodiment, the EDA tool includes: (1) a critical path/cell identifier configured to identify critical paths and critical cells in a block of the IC, (2) a candidate PM position identifier coupled to the critical path/cell identifier and configured to identify a set of candidate positions in the block for the PMs, (3) a cluster generator coupled to the critical path/cell identifier and configured to associate the critical cells to form clusters thereof and (4) a PM placement optimizer coupled to the candidate PM position identifier and the cluster generator and configured to place a PM within each of the clusters by selecting among the candidate positions based on a quality function.

Another aspect of the invention provides a method of optimizing a placement of PMs in an IC. In one embodiment, the method includes: (1) identifying critical paths and critical cells in the IC, (2) identifying a set of candidate positions for the PMs, (3) associating the critical cells to form clusters thereof and (4) placing a PM within each of the clusters by selecting among the candidate positions.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Adaptive voltage scaling and optimization (AVSO) represents a significant improvement over adaptive voltage scaling. AVSO not only allows an IC to be designed faster than conventionally thought possible, it allows the architecture of the IC to be chosen such that it can be powered at the lowest possible voltage without sacrificing performance.

ICs employing adaptive voltage scaling or AVSO have PMs located in a regular pattern over their area to monitor various operating parameters. PMs are relatively small and simple circuits designed to measure signal propagation speed in nearby cells (e.g., transistors). PMs may therefore be regarded as speed monitors. While the IC is operating, the PMs determine whether or not the signal propagation speeds in nearby cells are slower or faster than expected and generate output voltages or digital values that reflect any speed difference. A voltage management unit (VMU) receives the voltages or values and controls voltage regulators associated with each voltage domain of the IC to increase or decrease supply voltages as needed. AVSO has demonstrated its ability to conserve energy and therefore is expected to be evermore widely used in future ICs. However, it has been discovered that the conventional PM placement techniques are inadequate.

Any PM placement technique first involves identifying "critical paths" in an IC using a conventional timing analysis tool. Critical paths are signal paths that exhibit the highest delay and are therefore the most sensitive to excessive variations in supply voltage. The cells in a critical path are called "critical cells." Ideally, at least one (and sometimes several) PMs should be placed near each critical path. Unfortunately this comprehensive approach is unworkable, since the number of critical paths in a real-world IC far exceeds the number of PMs that can be reasonably used. Thus conventional PM placement techniques involve either hand-placing PMs near only a small handful of critical paths in each clock domain of the IC or automatically placing PMs irrespective of the location of critical paths (e.g., regularly over the area of the IC). Unfortunately, the former technique is tedious, conducive to error, leaves the majority of critical paths unmonitored and is therefore generally disfavored. The automated PM placement technique invariably results in some PMs being placed such that they are not near any critical paths. Consequently, those PMs do not provide any meaningful information to the VMU and are essentially wasted.

Figure 1:
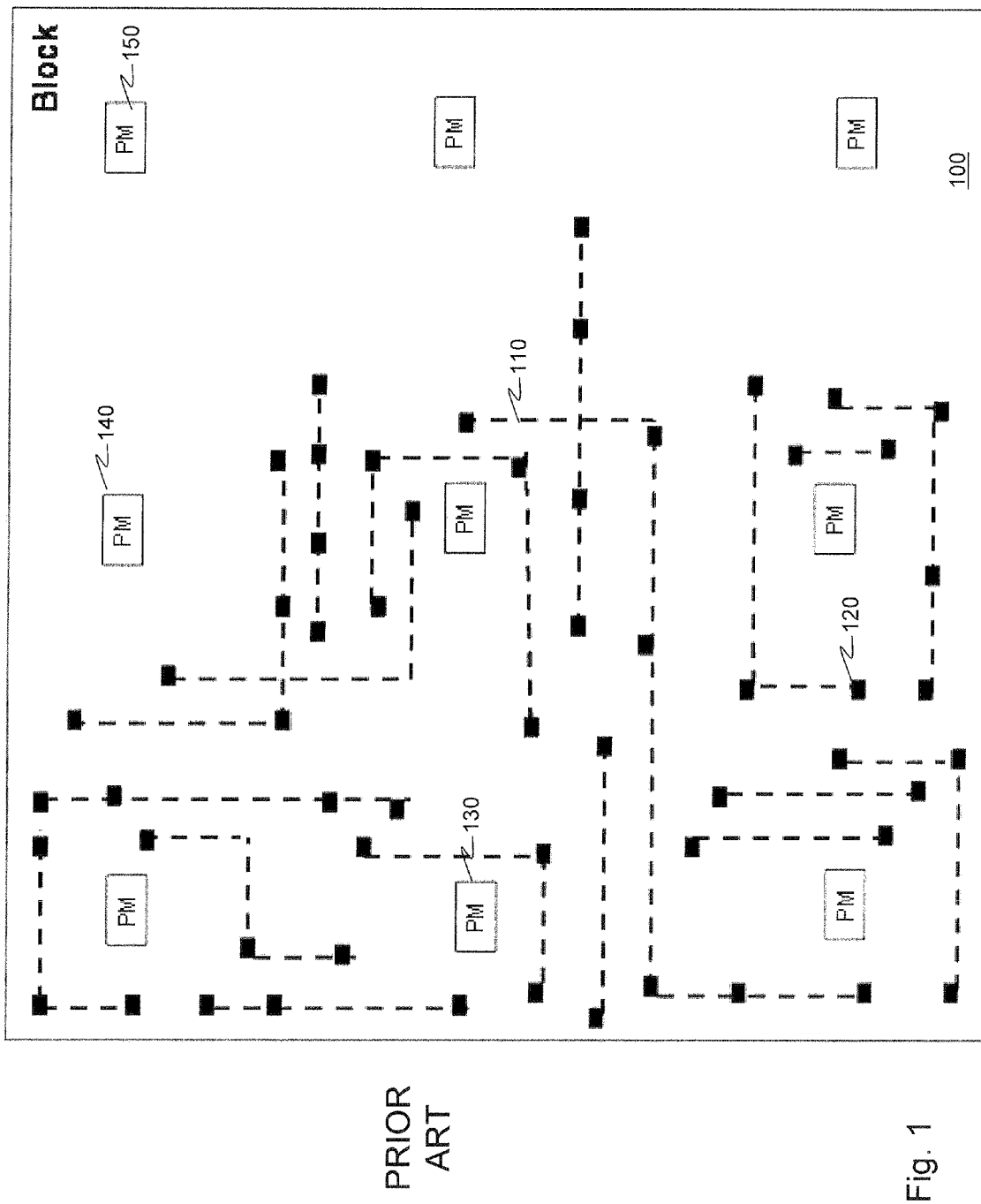
FIG. 1 is a diagram of one block of an IC having critical paths and PMs distributed about the IC according to a conventional automated PM placement technique.

To illustrate the latter, FIG. 1 shows one block 100 of an IC having critical paths 110 made up of interconnected cells 120. In the illustrated embodiment, the block 100 constitutes a clock domain in the IC. In alternative embodiments, the block 100 is another kind of subdivision, or an entirety, of the IC.

Nine PMs, including referenced PMs 130, 140, 150, are distributed about the block 100 according to a conventional automated PM placement technique, i.e., regularly in a 3×3 grid. Four PMs, including the referenced PMs 140, 150, are placed too far from real critical paths and are wasted. The remaining five PMs, including the referenced PM 130, do not properly monitor the critical paths, since their placement failed to take critical path location into account.

EDA tools, a category of computer aided design (CAD) tools, are used by electronic circuit designers to create ICs. EDA tools allow designers to construct a circuit and simulate its performance using a computer and without requiring the costly and lengthy process of fabrication. For this reason, EDA tools have proven useful and popular.

Described herein are various embodiments of an EDA tool and method for optimizing the placement of PMs in an IC. Fundamentally, the tool and method provide automated PM placement based on the location of critical paths. Some embodiments are mindful of limitations on the number of PMs that the VMU of a particular IC can accommodate. Other embodiments place PMs based on the amount of delay each critical path has.

Figure 2:
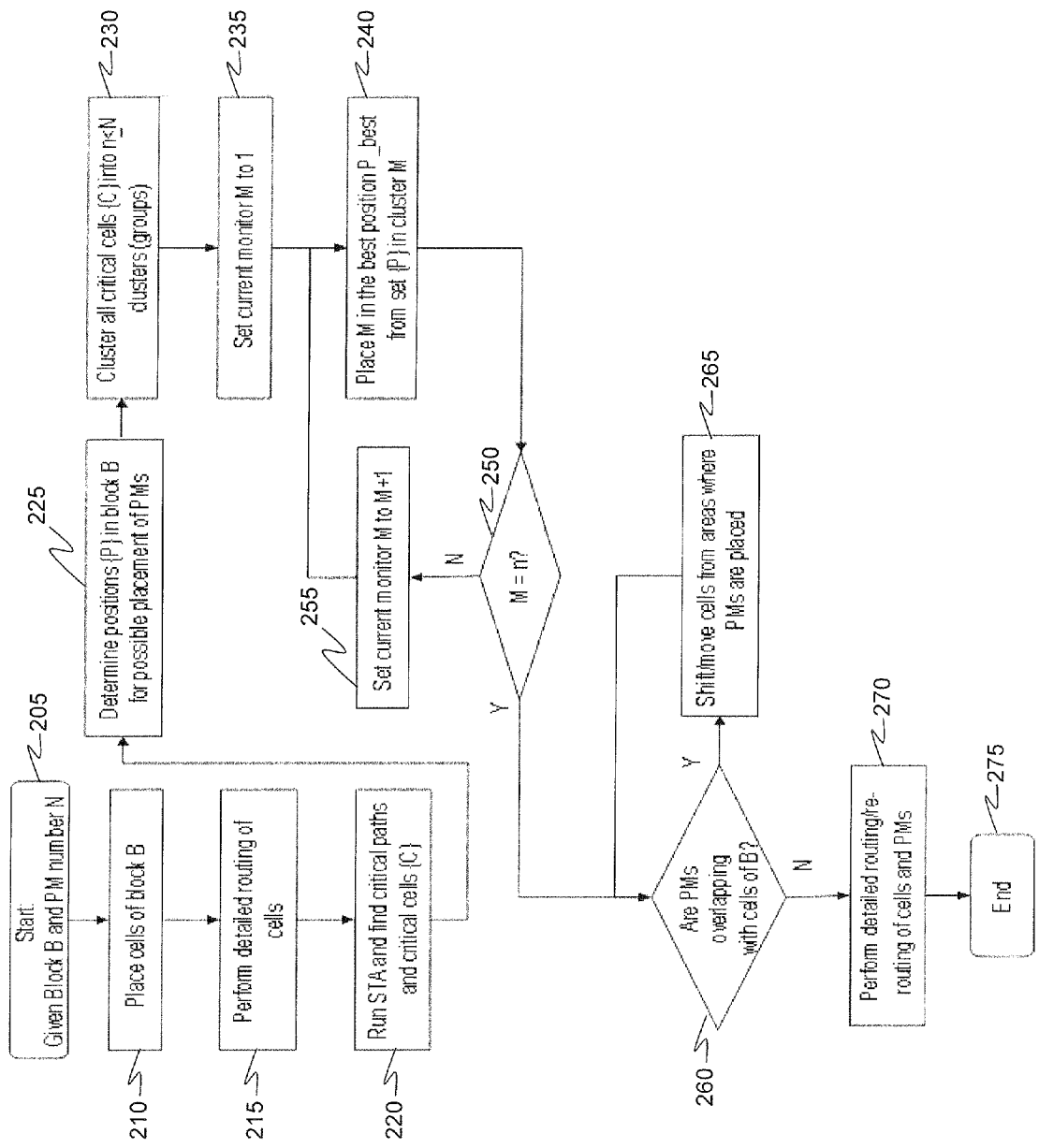
FIG. 2 is a flow diagram of one embodiment of a method of laying out an IC, including optimizing the placement of PMs in an IC carried out according to the principles of the invention.

One embodiment of the method will now be described. FIG. 2 is a flow diagram of one embodiment of a method of laying out an IC, including optimizing the placement of PMs in an IC carried out according to the principles of the invention. The method solves the task of finding the best PM placement (in sense of the best critical path coverage) with a maximum allowed number N of PMs. A typical IC may have about 10 blocks. About 10 PMs may be allocated to each block of a typical IC, so N≈100.

The method begins in a step 205 in which a block B of an IC is to be laid out with various cells and interconnects and N PMs. Cells in the block B are placed in a step 210. Interconnects are routed among the cells in a step 215. A static timing analysis (STA) is run in a step 220. Among other things, the STA identifies critical paths (and critical cells C) in the block B.

In a step 225, a set {P} is assembled of candidate positions in the block B for possible placement of PMs. Each PM requires area A (in a shape of the rectangle) to be placed. Each empty area of the block B that can accommodate the rectangle A is included as a possible position into the set {P} (these positions will not require any future shifting of cells). Then, a set {R} of regular positions is introduced such that the number |{R}| of these positions is much greater than N. This results in a fine grid set of candidate positions. Note that the set {R} may overlap with cells in the block B. The final set {P} of possible positions is a union of the set {P} and the set {R}.

Figure 3:
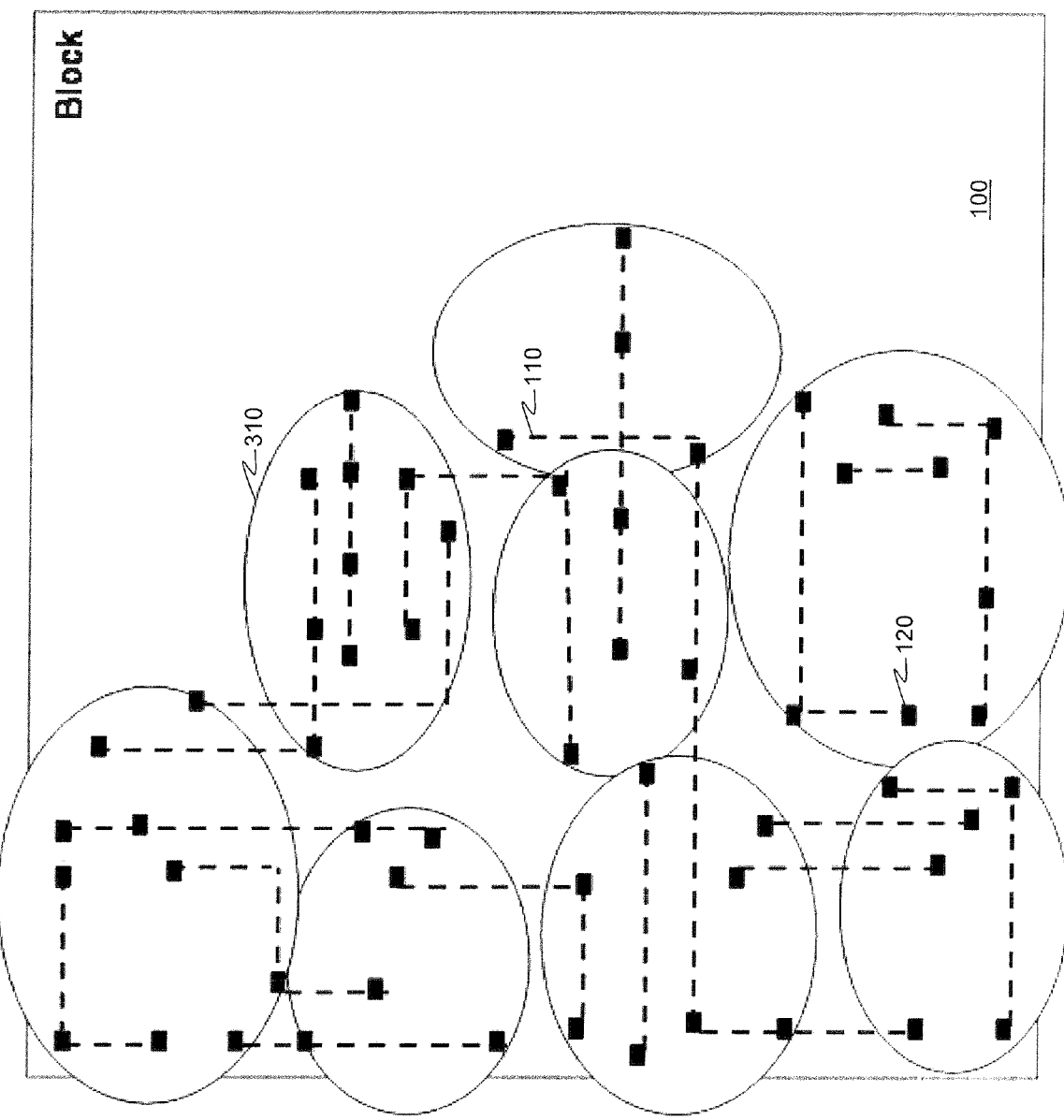
FIG. 3 is a diagram of one block of an IC having critical paths showing, in particular, clusters of critical cells associated with the critical paths.

In a step 230, critical cells {C} are associated together to form n clusters, n≦N. In one embodiment, all critical cells {C} are clustered into n<N clusters. FIG. 3 is a diagram of one block of an IC having critical paths showing clusters, including one cluster referenced as 310.

One embodiment is directed to solving a more complex task: finding the minimum number n<N of monitors and their optimal placement (subject to coverage requirements). Therefore, in one embodiment of the method, n is as small as possible without sacrificing coverage.

If n is to equal N, an N clusters and PMs will be used. If the minimum number of PMs is wanted (n is as small as possible), then the task becomes to find the minimum number of clusters to cover all critical cells {C}. This requires a conventional optimization heuristic, which those skilled in the pertinent art understand. FIG. 3 shows eight clusters (including the referenced cluster 310). This is less than the nine PMs evident in FIG. 1. This reduction may or may not be the result of optimization. If the reduction is the result of optimization, further or more effective optimization may result in a further reduction. In the illustrated embodiment, each cluster covers about the same area A, and the shape of each cluster is approximately circular. In alternative embodiments, the clusters are of different size and shape.

The area of area A may be defined, for example, in terms of the delay variation V that can be expected within one unit of the distance from a given point on the IC. This delay variation V depends on process variation and temperature gradient and possibly voltage supply variation. For example, the delay variation V may be 0.8% for each 1 mm. If during timing signoff a margin M is used to cover the above mentioned variations, a maximum distance D must be less than M/V. In this case, the total variation is given by:

$$D*V<M,$$

where D is the distance between a given points 1 and 2. For example, if M=2%, then D=2%/0.8%=1.5 mm. The limitation in area A on the cluster area is $A=\pi D^2$.

In some cases, it may be known that a region of an IC has a different delay variation V for each length unit. For example, regions around memories have a higher delay variation V, because memories exhibit larger voltage drops. In other cases, an IR drop may produce a higher delay variation V in the center of the IC. Consequently, the area A limitation may be different for different IC areas.

Finally, process variations are often not uniform. Variations in vertical direction may be different from variations in horizontal directions. In this case, cluster shapes may more advantageously be elliptical rather than circular.

In a step 235, a current monitor counter is set equal to one, designating a first PM and a first cluster. In a step 240, the first PM is automatically placed in a "best position" P_best for monitoring the first cluster. In the illustrated embodiment, the "best position" is found by tentatively placing a PM at each candidate position in the set P that lies within the cluster M. In the illustrated embodiment, a quality function Q(M,P) is calculated to estimate position P, and the position having minimum value of Q(M,P) is selected as the "best position" P_best.

The function Q(M,P) may take many different forms. In general, the best position P_best is a position P that is closest to all critical cells {C(M)} within the cluster M. The following function Q(M,P), which calculates the average distance between a position P and critical cells {C(M)} is illustrative, but only an example:

Q(M,P)=Sum{Distance(P,Cell) for each Cell from {C(M)}}/m, where m=|{C(M)}| is the number of critical cells in the cluster M. In other words, P-best is the position from {P(M)} that is closest to the center of the coordinates of critical cells C in the cluster M. Note that many variations of function Q(M,P) exist. For example, a sum can be taken with some weights to guide placing a PM closer to receiving or sending flip-flops or critical cells with greater delays. Also, some additional penalty may be added to Q(M,P) to avoid using a position P that would require shifting critical cells (having a higher penalty) versus other cells (having a lower penalty). Although the contents of the quality function may differ, those skilled in the pertinent art are aware of quality functions and, given this disclosure, their application to this "best position" problem.

Having selected P_best from the set of candidate positions {P} that was identified in the step 225, P_best is removed from the set. In a decisional step 250, it is determined whether or not M equals n. If not, M is incremented by one in a step 255, designating a second PM and a second cluster. The step 240 is carried out again, and the process of placing further PMs in further clusters continues until M=n as the decisional step 250 indicates.

When M=n, it is determined in a decisional step 260 whether any PMs that have been placed are inadvertently overlapping any cells (critical or otherwise) in the block B. If so, those PMs are removed in a step 265. The steps 260, 265 are carried out repeatedly until no PMs are overlapping any cells.

In a step 270, interconnects are routed to connect the PMs and the IC's VMU. Any rerouting of interconnects routed in the step 215 also may occur in the step 270. The method ends in a step 275. As a result, all PMs having been placed in optimal positions within clusters.

Figure 4:
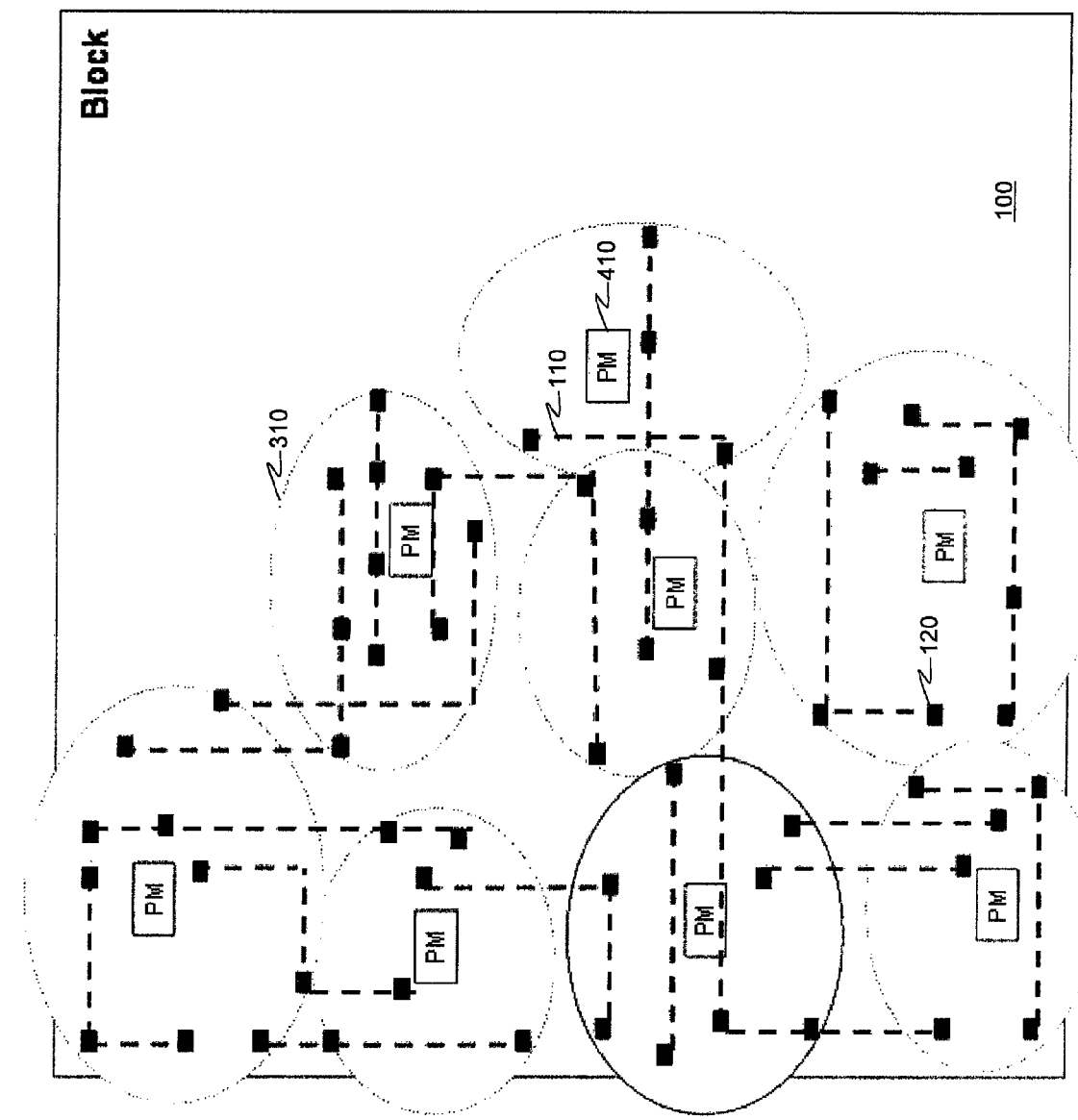
FIG. 4 is a diagram of the block, critical paths, critical cells and clusters of FIG. 3 showing, in particular, the placement of PMs with respect to the clusters.
Figure 5:
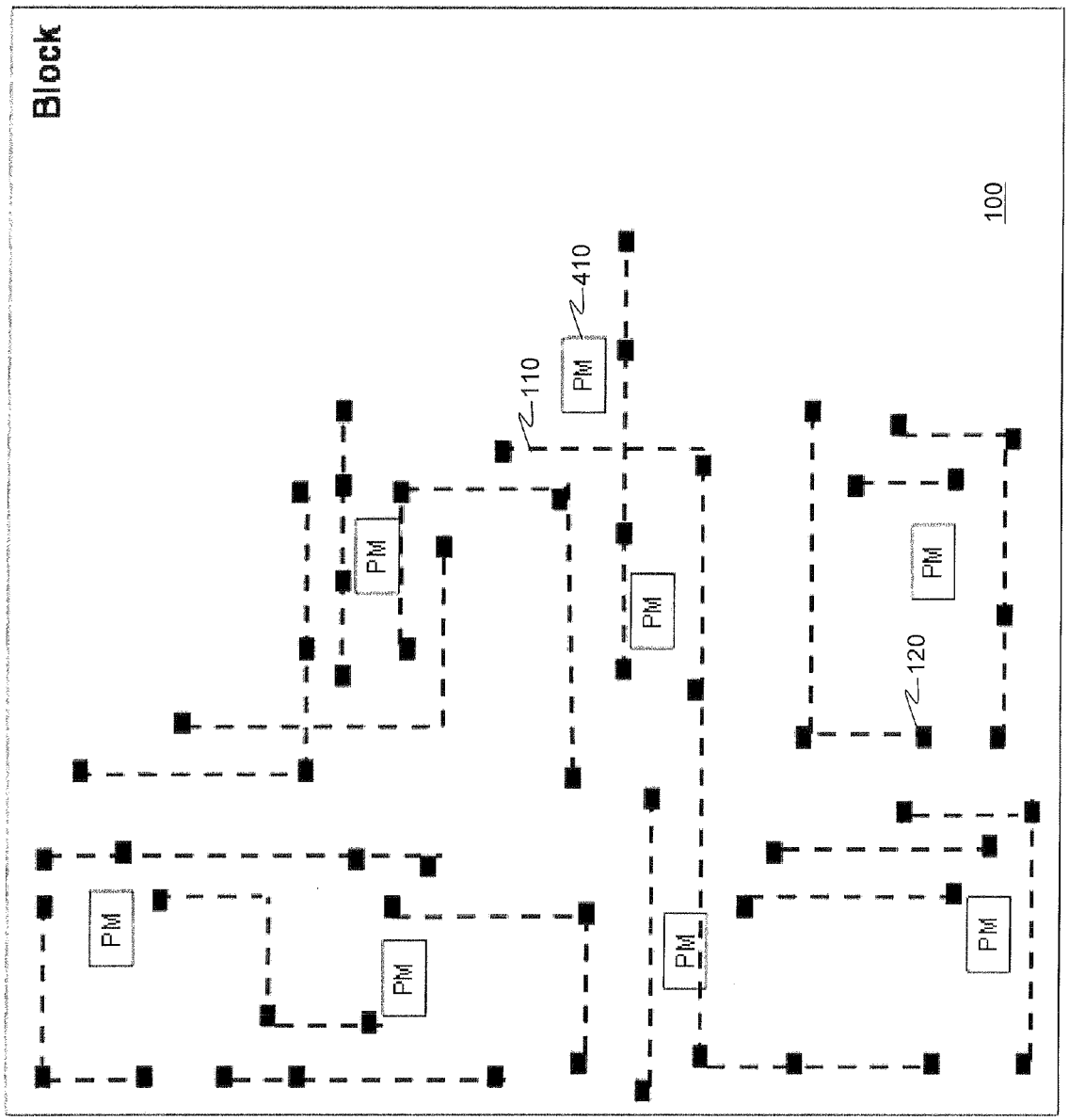
FIG. 5 is a diagram of the block of the IC and critical paths of FIG. 4 showing, in particular, the placement of PMs with respect to the critical paths.

FIG. 4 is a diagram of the block, critical paths, critical cells and clusters of FIG. 3 showing, in particular, the placement of PMs (including one PM 410) with respect to the clusters. FIG. 5 is a diagram of the block and critical paths of FIG. 4 showing, in particular, the placement of PMs with respect to the critical paths. FIG. 5 shows the final result for placement of eight PMs (including the PM 410).

Figure 6:
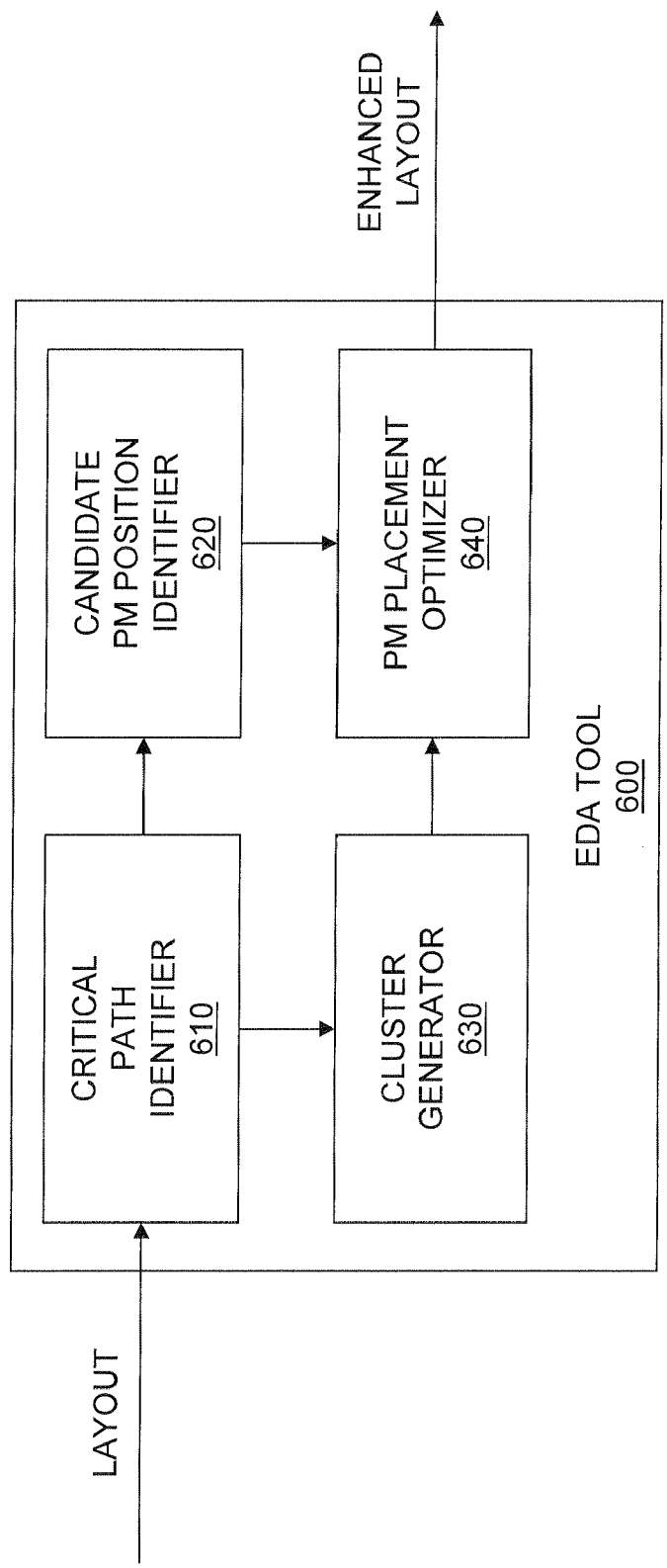
FIG. 6 is a block diagram of one embodiment of an EDA tool for optimizing the placement of PMs in an IC carried out according to the principles of the invention.

FIG. 6 is a block diagram of one embodiment of an EDA tool 600 for optimizing the placement of PMs in an IC carried out according to the principles of the invention. The EDA tool 600 includes a critical path/cell identifier 610. The critical path/cell identifier 610 is configured to identify critical paths and critical cells in the IC. In one embodiment, the critical path/cell identifier 610 operates on the IC one block at a time; the block may be a clock domain or another subdivision of the IC. The EDA tool 600 further includes a candidate PM position identifier 620. The candidate PM position identifier 620 is coupled to the critical path/cell identifier 610 and is configured to identify a set of candidate positions for the PMs. In one embodiment, the candidate position identifier 620 identifies a fine grid set of positions at which PMs may be located. The EDA tool 600 further includes a cluster generator 630. The cluster generator 630 is coupled to the critical path/cell identifier 610 and configured to associate the critical cells with one another such that clusters are formed. In one embodiment, the clusters are of the same area and shape. However, this need not be the case. In one embodiment, the number of clusters is minimized subject to coverage constraints. However, this need not be the case.

The EDA tool 600 further includes a PM placement optimizer 640. The PM placement optimizer 640 is coupled to the candidate PM position identifier 620 and the cluster generator 630 and is configured to place a PM within each of the clusters by selecting among the candidate positions identified by the candidate PM position identifier 620. In one embodiment, the PM placement optimizer 640 selects a best position based on a quality function. However, this need not be the case. Ultimately, the EDA tool 600 produces an enhanced layout containing interconnects that couple the PMs to the IC's VMU.

Certain embodiments of the invention further relate to computer storage products with a computer-readable medium that have program code thereon for performing various computer-implemented operations that embody the tools or carry out the steps of the methods set forth herein. The media and program code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which the invention relates will appreciate that other and further additions, deletions, substitutions and modifications may be made to the described embodiments without departing from the scope of the invention. For example, the tools and methods described herein may be employed for optimal placement of other types of monitors (such as temperature or process monitors) in ICs without AVSO, but with some process/operation variation control.

What is claimed is:

1. An electronic design automation tool for optimizing a placement of process monitors in an integrated circuit, comprising:
   a critical path/cell identifier configured to identify critical paths and critical cells in said integrated circuit, wherein said critical paths are signal paths that exhibit a highest delay and are most sensitive to excessive variations in supply voltage;
   a candidate process monitor position identifier coupled to said critical path/cell identifier and configured to identify a set of candidate positions for said process monitors, wherein said process monitors are circuits configured to measure signal propagation speed in nearby cells;
   a cluster generator coupled to said critical path/cell identifier and configured to associate said critical cells to form clusters thereof; and
   a process monitor placement optimizer coupled to said candidate process monitor position identifier and said cluster generator and configured to place a process monitor within each of said clusters and near said critical paths/cells by selecting among said candidate positions.

2. The electronic design automation tool as recited in claim 1 wherein said critical path/cell identifier operates on said integrated circuit one block at a time, said block being a clock domain of said integrated circuit.

3. The electronic design automation tool as recited in claim 1 wherein said candidate position identifier identifies a fine grid set of positions at which said process monitors may be located.

4. The electronic design automation tool as recited in claim 1 wherein said clusters are of a same area and shape.

5. The electronic design automation tool as recited in claim 1 wherein said process monitor placement optimizer selects a best position based on a quality function.

6. The electronic design automation tool as recited in claim 5 wherein said quality function relates average distances between a candidate position and critical cells in said cluster.

7. The electronic design automation tool as recited in claim 1 wherein said electronic design automation tool is configured to couple said process monitors to a voltage management unit of said integrated circuit.

8. A non-transitory computer-readable medium containing program code which, when executed by a processor of a computer, causes said processor to perform a method of optimizing a placement of process monitors in an integrated circuit, said method comprising:
identifying critical paths and critical cells in said integrated circuit, wherein said critical paths are signal paths that exhibit a highest delay and are most sensitive to excessive variations in supply voltage;
identifying a set of candidate positions for said process monitors, wherein said process monitors are circuits configured to measure signal propagation speed in nearby cells;
associating said critical cells to form clusters thereof; and
placing a process monitor within each of said clusters and near said critical paths/cells by selecting among said candidate positions.

9. The method as recited in claim 8 wherein said method is carried out on said integrated circuit one block at a time, said block being a clock domain of said integrated circuit.

10. The method as recited in claim 8 wherein said identifying said set of candidate positions comprises identifying a fine grid set of positions at which said process monitors may be located.

11. The method as recited in claim 8 wherein said clusters are of a same area and shape.

12. The method as recited in claim 8 wherein said placing comprises selecting a best position based on a quality function.

13. The method as recited in claim 12 wherein said quality function relates average distances between a candidate position and critical cells in said cluster.

14. The method as recited in claim 8 further comprising coupling said process monitors to a voltage management unit of said integrated circuit.

15. An electronic design automation tool for optimizing a placement of process monitors in an integrated circuit, comprising:
a critical path/cell identifier configured to identify critical paths and critical cells in a block of said integrated circuit, wherein said critical paths are signal paths that exhibit a highest delay and are most sensitive to excessive variations in supply voltage;
a candidate process monitor position identifier coupled to said critical path/cell identifier and configured to identify a set of candidate positions in said block for said process monitors, wherein said process monitors are circuits configured to measure signal propagation speed in nearby cells;
a cluster generator coupled to said critical path/cell identifier and configured to associate said critical cells to form clusters thereof; and
a process monitor placement optimizer coupled to said candidate process monitor position identifier and said cluster generator and configured to place a process monitor within each of said clusters and near said critical paths/cells by selecting among said candidate positions based on a quality function.

16. The electronic design automation tool as recited in claim 15 wherein said candidate position identifier identifies a fine grid set of positions at which said process monitors may be located.

17. The electronic design automation tool as recited in claim 15 wherein said clusters are of a same area and shape.

18. The electronic design automation tool as recited in claim 15 wherein said quality function relates average distances between a candidate position and critical cells in said cluster.

19. The electronic design automation tool as recited in claim 15 wherein said electronic design automation tool is configured to couple said process monitors to a voltage management unit of said integrated circuit.

20. The electronic design automation tool as recited in claim 15 wherein said electronic design automation tool is embodied in program code stored on a non-transitory computer-readable storage device.

* * * * *